United States Patent
Ahlers et al.

(10) Patent No.: US 6,765,262 B2
(45) Date of Patent: Jul. 20, 2004

(54) VERTICAL HIGH-VOLTAGE SEMICONDUCTOR COMPONENT

(75) Inventors: Dirk Ahlers, München (DE); Wolfgang Werner, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/244,789

(22) Filed: Sep. 16, 2002

(65) Prior Publication Data

US 2003/0057479 A1 Mar. 27, 2003

Related U.S. Application Data

(63) Continuation of application No. PCT/DE01/00908, filed on Mar. 9, 2001.

(30) Foreign Application Priority Data

Mar. 15, 2000 (DE) .......................................... 100 12 610

(51) Int. Cl.$^7$ ............................................. H01L 29/772
(52) U.S. Cl. ......................... 257/328; 257/335; 257/548
(58) Field of Search ................................ 257/327–346, 257/548

(56) References Cited

U.S. PATENT DOCUMENTS

| | | |
|---|---|---|
| 4,754,310 A | 6/1988 | Coe |
| 5,264,719 A | 11/1993 | Beasom |
| 6,097,063 A * | 8/2000 | Fujihira ........................ 257/339 |
| 6,465,869 B2 * | 10/2002 | Ahlers et al. ................. 257/548 |
| 6,507,071 B1 * | 1/2003 | Tihanyi ........................ 257/343 |

FOREIGN PATENT DOCUMENTS

| | | |
|---|---|---|
| DE | 198 18 298 C1 | 6/1999 |
| EP | 0 167 813 A1 | 1/1986 |
| EP | 0 822 600 A1 | 2/1998 |

* cited by examiner

*Primary Examiner*—Wael Fahmy
*Assistant Examiner*—Marcos D. Pizarro-Crespo
(74) *Attorney, Agent, or Firm*—Laurence A. Greenberg; Werner H. Stemer; Ralph E. Locher

(57) ABSTRACT

The present invention relates to a high-voltage semiconductor component having a semiconductor substrate of a first conduction type on which a semiconductor layer is provided as a drift path that takes up the reverse voltage of the semiconductor component. The semiconductor layer is either of the first conduction type or of a second conduction type that is opposite the first conduction type. The semiconductor layer is more weakly doped than the semiconductor substrate. Laterally oriented semiconductor regions of the first and second conduction types are alternately provided in the semiconductor layer. Furthermore, the present invention relates to a high-voltage semiconductor component having a MOS field-effect transistor that is formed in a semiconductor substrate and has a drift path that is connected to its drain electrode.

10 Claims, 2 Drawing Sheets

VERTICAL HIGH-VOLTAGE SEMICONDUCTOR COMPONENT

CROSS-REFERENCE TO RELATED APPLICATION

This application is a continuation of copending International application PCT/DE01/00908, filed Mar. 9, 2001, which designated the United States, and which was not published in English.

BACKGROUND OF THE INVENTION

Field of the Invention

The present invention relates to a high-voltage semiconductor component having a semiconductor substrate of a first conduction type on which a semiconductor layer is provided as a drift path that takes up the reverse voltage of the semiconductor component. The semiconductor layer is either of the first conduction type or of a second conduction type that is opposite the first conduction type. The semiconductor layer is more weakly doped than the semiconductor substrate. Laterally oriented semiconductor regions of the first and second conduction types are alternately provided in the semiconductor layer. Furthermore, the present invention relates to a high-voltage semiconductor component having a MOS field-effect transistor that is formed in a semiconductor substrate and has a drift path that is connected to its drain electrode.

In a semiconductor component known from U.S. Pat. No. 4,754,310, two trench electrodes are provided at a distance from one another in a surface of a semiconductor element.

These trench electrodes adjoin semiconductor regions of different conduction types. This means that a first trench electrode adjoins a p-type conductive area, while a second trench electrode is provided in an n-type conductive area. Between these two areas of different conduction types, there extend laterally alternating p-type and n-type conductive regions that form electrically parallel current paths that considerably reduce the series resistance in the region of the body of the semiconductor component without adversely affecting its blocking capability.

Even high-voltage transistors that operate according to the compensation principle have laterally extending n-type and p-type conductive layers that are arranged alternately with respect to one another and that are preferably manufactured by epitaxy. The source and drain terminals of these high-voltage transistors are provided on the same surface of a semiconductor element.

However, there are also high-voltage DMOS (Diffused Metal Oxide Semiconductor) transistors that also operate according to the compensation principle, and for this purpose, are implemented in what is referred to as hybrid construction technology in which vertically extending n-type and p-type conductive column-shaped regions are provided in the drift path which take up the reverse voltage. These high-voltage DMOS transistors are distinguished by a considerable reduction in the switch-on resistance, that is to say by an enormous Ron gain. However, the multiple epitaxy that is used in the hybrid construction technology entails relatively high costs.

In order to avoid these costs, consideration has therefore already been given to manufacturing the column-like regions by performing trench etching and subsequent epitaxial filling. However, despite extensive trials it has not been possible to date to find a way of permitting such high-voltage DMOS transistors to be fabricated satisfactorily on a large scale.

In particular, Issued German Patent DE 198 18 298 C1 discloses a super-low-impedance vertical MOSFET in which the source and the gate are provided on one surface of a semiconductor element and the drain is provided on the opposite surface of the semiconductor element. Column-like zones run in the direction from the one surface to the opposite surface. These zones are of a different conduction type and are arranged in a drift zone in the semiconductor element. In addition, the drift zone has a plurality of areas of alternate opposite conduction types which extend perpendicularly with respect to the column-like zones and with which contact is made using the column-like zones that are arranged spaced apart from one another. This MOSFET is manufactured using epitaxy and ion implantation steps.

SUMMARY OF THE INVENTION

It is accordingly an object of the invention to provide a high-voltage semiconductor component which overcomes the above-mentioned disadvantages of the prior art apparatus of this general type.

In particular, it is an object of the invention to provide a high-voltage semiconductor component that is capable of operating according to the compensation principle and that can be manufactured relatively easily so that it has low manufacturing costs.

With the foregoing and other objects in view there is provided, in accordance with the invention, a high-voltage semiconductor component including: a semiconductor substrate of a first conduction type; a first electrode configured on the semiconductor substrate; a second electrode; and a plurality of alternately configured semiconductor regions including laterally oriented semiconductor regions of the first conduction type and laterally oriented semiconductor regions of a second conduction type opposite the first conduction type. The semiconductor regions of the first conduction type are connected to the semiconductor substrate, and the semiconductor regions of the second conduction type are connected to the second electrode. The high-voltage semiconductor component also includes a semiconductor layer of the second conduction type provided as a region for taking up a reverse voltage. The semiconductor layer is more weakly doped than the semiconductor substrate. The semiconductor layer is located between the semiconductor substrate and the plurality of the alternately configured semiconductor regions. The high-voltage semiconductor component also includes an electrically conductive connection routed through the semiconductor layer. The electrically conductive connection electrically connects the semiconductor regions of the first conduction type to the semiconductor substrate. The high-voltage semiconductor component also includes a further conductive connection routed through the plurality of the alternately configured semiconductor regions. The further conductive connection electrically connects the semiconductor regions of the second conduction type to the second electrode. The second electrode is provided on the semiconductor layer.

In other words, the semiconductor regions of the first conduction type are connected, by an electrical conductive connection routed through the semiconductor layer, to the semiconductor substrate on which a first electrode arranged. The semiconductor regions of the second conduction type are connected, by a further conductive connection routed through the semiconductor regions, to a second electrode provided on the semiconductor layer.

The high-voltage semiconductor component is thus per se a vertical component as the two electrodes are provided on opposite faces of the semiconductor chip. However, it combines, in a surprisingly simple way, the advantages of lateral arrangements and vertical arrangements. The source and the drain terminal of a high-voltage transistor which extends vertically and which operates according to the compensation principle are provided with a laterally extending drift path. This source terminal or drain terminal is connected to the semiconductor substrate in such a way that a structure is produced with a common source or with a common drain.

The manufacturing costs for the high-voltage semiconductor component are considerably reduced as the n-type and p-type (p-type and n-type) conductive layers which form the semiconductor regions of the first and second conduction types can be manufactured in one epitaxy step and the conductive connections can readily be formed, for example, from trenches which are filled with n-type doped or p-type doped polycrystalline silicon. Of course, other suitable materials can also be selected for these conductive connections. Here, only small requirements with respect to the shape of these trenches and their surface condition have to be fulfilled. All that it is necessary to ensure is that there is a pn-type junction between the trenches and the monocrystalline semiconductor material, which is preferably silicon, and this is something that can be achieved by outdiffusion.

The distance between the semiconductor regions of the first and second conduction types, that is to say, the distance between n-type and p-type conductive layers can be considerably reduced as this distance is completely independent of the grid pattern of the cells which form the high-voltage semiconductor component. Typical dimensions for this distance between the semiconductor regions of the first and second conduction types are between 1 and 5 $\mu$m. The entire thickness of all of the semiconductor regions of the first and second conduction types may be between 5 and 30 $\mu$m, but lower or higher values are also possible.

By reducing the distance between the semiconductor regions, that is to say, the layer spacing between the n-type and p-type conductive layers, the doping of the individual regions or layers can be correspondingly increased.

A reduction of the switch-on resistance by a factor of approximately 0.3 can be expected when the distance between the semiconductor regions and layers is approximately 2 $\mu$m, and when the drift path has an entire thickness of approximately 20 $\mu$m.

It is particularly advantageous that with the high-voltage semiconductor component there is basically no need for edge termination because of the lateral design of the alternating semiconductor regions of different conduction types, which, in the case of small chip areas, signifies a considerably savings in area.

One advantageous development of the invention is that, in addition, field plates are applied to the underside and/or upper side of the drift path. The upper side of the drift path is to be understood here as being the chip surface. The distribution of the electrical field in the drift path is favorably influenced by these field plates since the field plates achieve the same effect as a variable "column doping" of the column-like regions mentioned at the beginning and they can be used to set a roof-shaped field profile in the drift path, which is necessary to provide immunity to avalanching. In order to achieve such high immunity to avalanching, higher doping is also expedient in the semiconductor regions or layers, since a dynamic field change in the case of breakdown occurs only at relatively high currents.

In order to achieve the above object, there is provided, a high-voltage semiconductor component with a MOS field-effect transistor that is formed in a semiconductor substrate and that has a drift path connected to its drain electrode. The drift path is located outside the source-gate region of the MOS field-effect transistor and is connected to this region by a switching element. The switching element is preferably formed by a junction field-effect transistor. If the drift path is formed in the way specified at the beginning, the junction field-effect transistor is composed of the semiconductor regions of the first conduction type and the further conductive connections which are interrupted by the latter, as will be explained in more detail further below.

In this high-voltage semiconductor component, the pinch-off voltage (switch-off voltage) of the junction field-effect transistor is lower than the breakdown voltage between the semiconductor regions of the second conduction type and a highly doped source-end "column" of the first conduction type, which connects the semiconductor regions of the first conduction type in the source-gate region or cell region to one another. This means that the junction field-effect transistor switches off before a breakdown can occur in the source-gate region or cell region of the semiconductor component.

When there is, for example, a configuration with a common drain, the $n^+$-type conductive column that connects the n-type conductive regions and that is composed of, for example, polycrystalline silicon, is not provided between the two electrically conductive connections, i.e, the drift path is separated from the cell area. In addition, the junction-field effect transistor, which is formed by the conductive connections and the semiconductor connections of the conduction type that are opposite to that of these conductive connections, is dimensioned in such a way that its pinch-off voltage is lower than the breakdown voltage for the p-type conductive semiconductive regions and the source-end $n^+$-type conductive column.

The same requirements apply for a configuration with a common source when the conduction types are correspondingly changed.

Other features which are considered as characteristic for the invention are set forth in the appended claims.

Although the invention is illustrated and described herein as embodied in vertical high-voltage semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
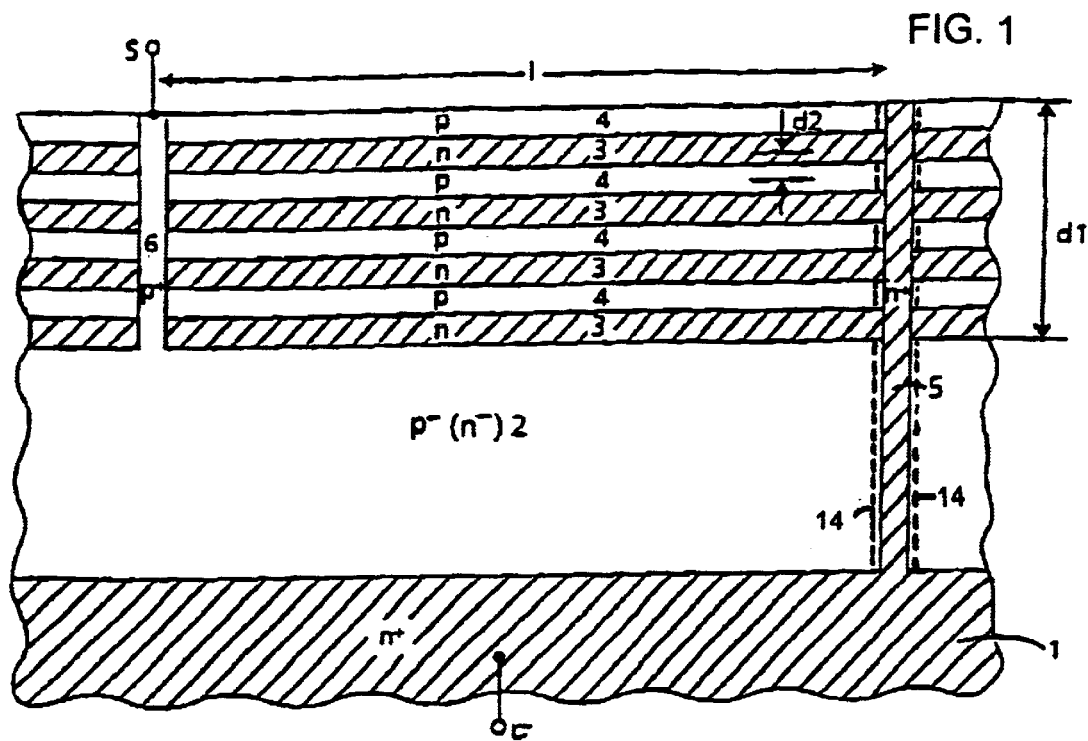
FIG. 1 is a schematic sectional view of a configuration with a common drain.

Referring now to the figures of the drawing in detail and first, particularly, to FIG. 1 thereof, there is shown a diode structure formed by a configuration with a common drain. The configuration is composed of an n$^+$-type conductive silicon substrate 1, and a p$^-$-type conductive silicon layer 2 that is provided on the silicon substrate 1. Instead of the p$^-$-type conductive silicon layer 2 it is also possible to use an n-type conductive silicon layer. In this p$^-$-type conductive silicon layer 2 there are alternating n-type and p-type conductive regions or layers 3, 4 that can be deposited epitaxially like the layer 2. The layers 3, 4 may have an overall thickness d1 between 5 and 30 $\mu$m, while the distance d2 between the individual regions or layers 3, 4 may be between 1 and 5 $\mu$m. Of course, dimensions that differ from the areas above are also possible here. The semiconductor material is likewise not restricted to silicon. Instead, other semiconductor materials, for example, SiC, $A_{III}B_v$ semiconductors, etc. may also be used.

An essential feature of the present invention is that the n$^+$-type conductive silicon substrate 1, to which a drain terminal D is applied, is connected to the n-type conductive regions or layers 3 via a conductive connection 5 composed of, for example, n$^+$-type conductive polycrystalline silicon. An additional essential feature is that a source terminal S is connected to the p-type conductive regions or layers 4 via a conductive column-shaped connection 6 composed of, for example p$^+$-type conductive polycrystalline silicon. Instead of polycrystalline silicon it is also possible to use some other suitable conductive material, such as metal.

The conductive connections 5, 6 may be manufactured relatively easily by performing trench etching, by subsequently filling in these trenches with the polycrystalline silicon and by performing outdiffusion in order to displace the pn-type junction into monocrystalline material as the requirements relating to the shape of these trenches and the surface condition are relatively undemanding. It is merely necessary for the individual regions or layers 3, 4 to be connected in a low-impedance fashion to the corresponding terminals D and S via the conductive connections 5, 6. Instead of polycrystalline silicon, it is also possible to use some other material, for example metal, or in particular, highly doped silicon, for the conductive connections. The pn-type junction that is formed by the outdiffusion is represented schematically in FIG. 1 for the connection 5 by using a dashed line 14.

Figure 2:
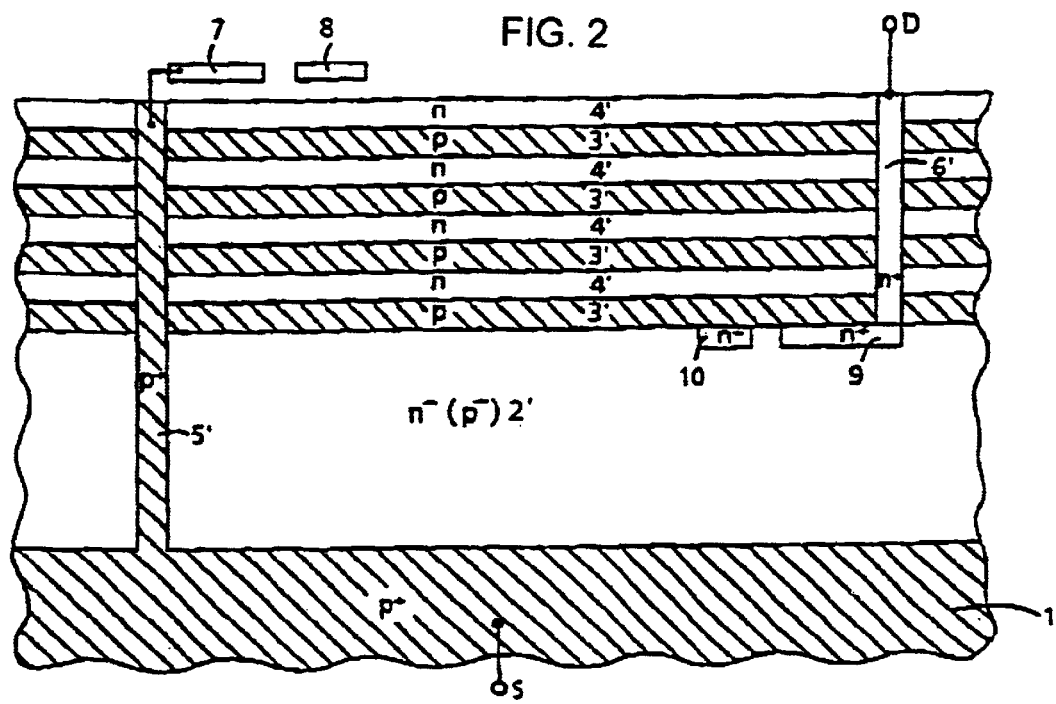
FIG. 2 is a schematic sectional view of a configuration with a common source.

FIG. 2 shows a schematic view of the source-drain arrangement of a configuration with a common source. The parts that are provided with the reference symbols 1' to 6', here are precisely the opposite conduction type to that of the parts 1 to 6 shown in FIG. 1. That means that on a p$^+$-conductive silicon substrate 1' there is an n$^-$-type conductive silicon layer on which in turn alternating p-type conductive regions or layers 3' or n-type conductive regions or layers 4' are arranged. The silicon substrate 1' is connected to the regions or layers 3' via a conductive connection 5' made of p$^+$-type doped polycrystalline silicon, while a drain terminal D is connected to the n-type conductive layers 4' via an n$^+$-type conductive connection 6 composed of polycrystalline silicon.

In addition to the exemplary embodiment shown in FIG. 1, the exemplary embodiment in FIG. 2 also shows field plates 7 to 10. The field plates 7 and 8 are provided on the chip surface in an insulating layer (not shown) and the field plates 9 and 10, are located on the underside of the regions 3' and 4'. The field plates 7 and 8 may be composed of, for example, aluminum, while the field plates 9 and 10 are n$^+$-type conductive zones. The field plate 7 is connected to the conductive connection 5', and the field plate 8 is floating. The field plate 9 is connected to the conductive connection 6', and the field plate 10 is floating.

These field plates can favorably influence the distribution of the electrical field in the drift path so that the same effect is obtained with column-like doped regions as with variable column doping in compensation components.

In order to simplify the illustration, FIG. 1, like FIG. 2, does not show the cell region with, in particular, one source zone and one gate electrode. This cell region can, however, be formed in the way illustrated in FIG. 3, further details of which will be given below. FIG. 1 and FIG. 2 therefore essentially show the drift path with a length l, which may be approximately 50 $\mu$m. This drift path may adjoin both sides of a cell region in each case. It is also possible to provide a plurality of cell regions, interrupted in each case by a drift path.

Figure 3:
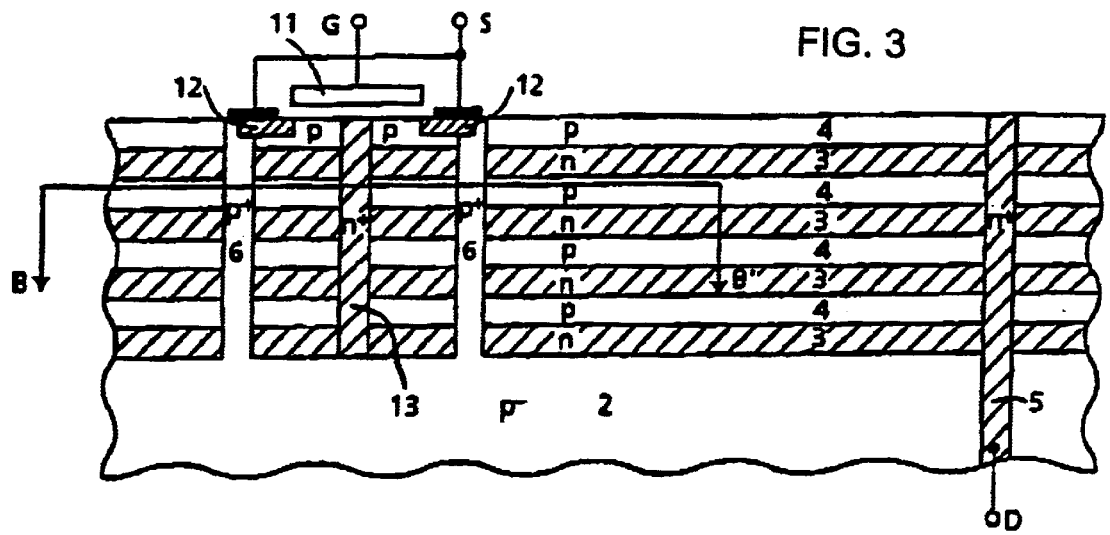
FIG. 3 is a schematic sectional view of a specific exemplary embodiment of a source-gate configuration for a common drain.

FIG. 3 shows the source-gate arrangement for a configuration with a common drain, that is to say, for the exemplary embodiment in FIG. 1. In addition to the configuration shown in FIG. 1, a cell region composed of a gate electrode 11 for a gate terminal G, a source zone 12 in the uppermost p-type conductive region 4, and an n$^+$-type conductive connection 13, which is structured in the same way as the connection 5, are also shown. The area between the two n$^+$-conductive connections 5 and 13 in FIG. 3 forms a half-cell here. In this case, the conductive connection 5, which connects the individual regions or layers 3 to one another, must be located outside the region between the p$^+$-type conductive connection or "source column" 6, and the n$^+$-type conductive connection 13.

Figure 4:
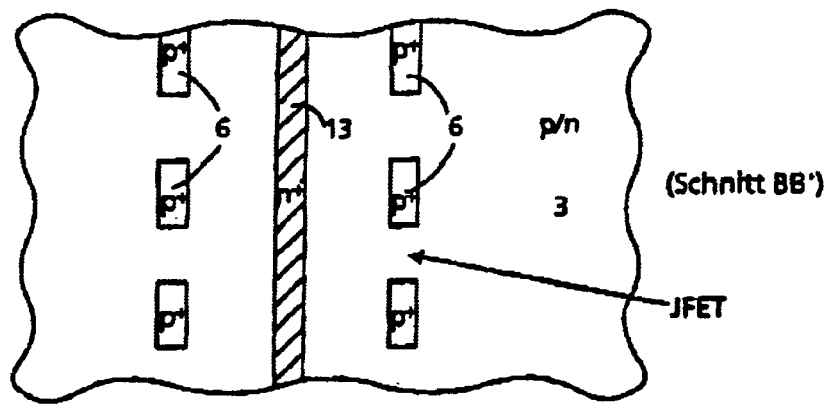
FIG. 4 is a cross sectional view taken through the line BB' in the exemplary embodiment shown in FIG. 3.

FIG. 4 (a sectional view taken through line B—B in FIG. 3) shows a junction field-effect transistor JFET that is formed by the column-shaped connections 6 and the layers 3 should be dimensioned in such a way that its pinch-off voltage is lower than the breakdown voltage between the p-type conductive regions 4 and the n$^+$-type conductive connection 13. As a result, the junction field-effect transistor switches off before a breakdown can occur in the cell region or in the drift path.

Figure 5:
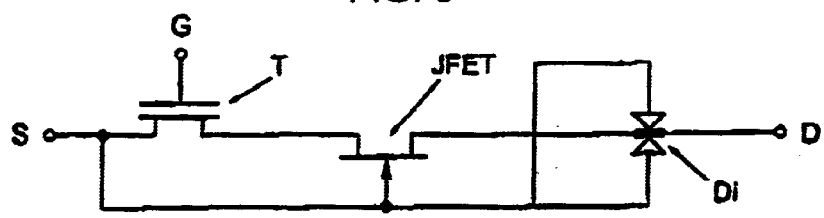
FIG. 5 is an equivalent circuit diagram for the exemplary embodiment shown in FIGS. 3 and 4.

FIG. 5 also shows an equivalent circuit diagram of the high-voltage semiconductor component, shown in FIGS. 3 and 4, having a MOS field-effect transistor composed of the cell region, the junction field-effect transistor JFET whose gate is formed by the connections 6 and whose channel is composed of the n-type conductive layers 3 between these connections 6, and diodes Di composed of the pn-type junctions between the layers 4 and the conductive connection 5.

We claim:

1. A high-voltage semiconductor component, comprising:
a semiconductor substrate of a first conduction type;
a first electrode configured on said semiconductor substrate;
a second electrode;
a plurality of alternately configured semiconductor regions including laterally oriented semiconductor regions of said first conduction type and laterally oriented semiconductor regions of a second conduction type opposite said first conduction type, said semiconductor regions of said first conduction type being connected to said semiconductor substrate, said semiconductor regions of said second conduction type being connected to said second electrode;

a semiconductor layer of said second conduction type provided as a region for taking up a reverse voltage, said semiconductor layer being more weakly doped than said semiconductor substrate, said semiconductor layer located between said semiconductor substrate and said plurality of said alternately configured semiconductor regions;

an electrically conductive connection routed through said semiconductor layer, said electrically conductive connection electrically connecting said semiconductor regions of said first conduction type to said semiconductor substrate; and a further conductive connection routed through said plurality of said alternately configured semiconductor regions, said further conductive connection electrically connecting said semiconductor regions of said second conduction type to said second electrode;

said second electrode being provided on said semiconductor layer.

2. The high-voltage semiconductor component according to claim 1, wherein:

said semiconductor regions of said first conduction type are formed as layers; and said semiconductor regions of said second conduction type are formed as layers.

3. The high-voltage semiconductor component according to claim 1, wherein: a distance between said semiconductor regions of said first conduction type and said semiconductor regions of said second conduction type is approximately between 1 and 5 $\mu$m.

4. The high-voltage semiconductor component according to claim 1, wherein: said semiconductor regions of said first conduction type and said semiconductor regions of said second conduction type together have an overall thickness approximately between 5 and 30 $\mu$m.

5. The high-voltage semiconductor component according to claim 1, wherein: said conductive connection and said further conductive connection are composed of a material selected from a group consisting of highly doped monocrystalline silicon and metal.

6. The high-voltage semiconductor component according to claim 1, wherein: said conductive connection and said further conductive connection are composed of doped polycrystalline silicon.

7. The high-voltage semiconductor component according to claim 6, comprising:

a monocrystalline region; and a pn-type junction a resulting from an outdiffusion extending in said monocrystalline region.

8. The high-voltage semiconductor component according to claim 1, comprising:

field plates;

said plurality of said alternately configured semiconductor regions having an upper side and a underside;

said field plates located on a region selected from a group consisting of said upper side and said underside.

9. The high-voltage semiconductor component according to claim 8, wherein: said field plates are positioned on said underside and are composed of highly doped areas of said second conduction type.

10. The high-voltage semiconductor component according to claim 8, wherein: said field plates are connected to an element selected from a group consisting of said conductive connection and said further conductive connection.

* * * * *